(12) United States Patent
Kwon et al.

(10) Patent No.: US 12,484,427 B2
(45) Date of Patent: Nov. 25, 2025

(54) DISPLAY DEVICE

(71) Applicant: Samsung Display Co., LTD., Yongin-si (KR)

(72) Inventors: Ohjeong Kwon, Yongin-si (KR); Seungyeon Jeong, Yongin-si (KR); Hyeoji Kang, Yongin-si (KR); Su Jeong Kim, Yongin-si (KR); Taeho Kim, Yongin-si (KR); Hongyeon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 370 days.

(21) Appl. No.: 18/335,231

(22) Filed: Jun. 15, 2023

(65) Prior Publication Data

US 2024/0155924 A1 May 9, 2024

(30) Foreign Application Priority Data

Nov. 9, 2022 (KR) .......................... 10-2022-0148542

(51) Int. Cl.
*H10K 59/80* (2023.01)
*H10K 59/12* (2023.01)
*H10K 59/38* (2023.01)

(52) U.S. Cl.
CPC ......... *H10K 59/8792* (2023.02); *H10K 59/38* (2023.02); *H10K 59/879* (2023.02)

(58) Field of Classification Search
CPC .. H10K 59/8792; H10K 59/38; H10K 59/879; H10K 50/86; H10K 59/12
See application file for complete search history.

(56) References Cited

U.S. PATENT DOCUMENTS

| | | | |
|---|---|---|---|
| 2014/0042396 A1* | 2/2014 | Yang | H10K 59/8792 257/40 |
| 2022/0238848 A1 | 7/2022 | Kwon et al. | |
| 2022/0285655 A1 | 9/2022 | Lee et al. | |
| 2023/0397462 A1* | 12/2023 | Cho | H10K 59/1213 |
| 2024/0122020 A1* | 4/2024 | Kim | H10K 59/353 |
| 2024/0155924 A1* | 5/2024 | Kwon | H10K 59/8792 |

FOREIGN PATENT DOCUMENTS

| | | |
|---|---|---|
| KR | 1020190110660 A | 10/2019 |
| KR | 1020220034291 A | 3/2022 |
| KR | 1020220086771 A | 6/2022 |
| KR | 1020220108287 A | 8/2022 |

* cited by examiner

*Primary Examiner* — Joseph L Williams
(74) *Attorney, Agent, or Firm* — CANTOR COLBURN LLP

(57) ABSTRACT

A display device includes a light emitting area and a light blocking area, a light emitting device layer including first through third light emitting devices corresponding to the light emitting area, a light blocking layer including a light blocking member which is in the light blocking area and defines a first opening overlapping the first light emitting device, a second opening overlapping the second light emitting device, and a third opening overlapping the third light emitting device, a color filter layer including a first color filter in the first opening and a second color filter in the second opening, and an anti-reflection layer on the light blocking layer and the color filter layer, the anti-reflection layer including a pigment or a dye. The light blocking layer together with the color filter layer and the anti-reflection layer defines a polarizer of the display device.

20 Claims, 8 Drawing Sheets

DISPLAY DEVICE

This application claims priority to Korean Patent Application No. 10-2022-0148542, filed on Nov. 9, 2022, and all the benefits accruing therefrom under 35 U.S.C. § 119, the content of which in its entirety is herein incorporated by reference.

BACKGROUND

1. Field

The disclosure relates to a display device. More specifically, the disclosure relates to a display device with improved display quality.

2. Description of the Related Art

As a display device includes wires and electrodes made of metal, external light incident on the display device may be reflected by the wires and electrodes. In order to prevent reflection by external light, a display device generally includes a polarizer. However, while the polarizer may prevent reflection by external light, light efficiency of the display device may be reduced due to the polarizer.

SUMMARY

Embodiments provide a display device with improved display quality.

A display device according to an embodiment includes a substrate including a light emitting area and a light blocking area surrounding the light emitting area, a light emitting device layer disposed on the substrate and including a first light emitting device, a second light emitting device, and a third light emitting device, an encapsulation layer disposed on the light emitting device layer, a light blocking member disposed in the light blocking area on the encapsulation layer and which defines a first opening overlapping the first light emitting device, a second opening overlapping the second light emitting device, and a third opening overlapping the third light emitting device, a color filter layer including a first color filter disposed to fill the first opening and a second color filter disposed to fill the second opening, and an anti-reflection layer covering the light blocking member and the color filter layer and including at least one selected from a pigment and a dye.

In an embodiment, the anti-reflection layer may be disposed to fill the third opening.

In an embodiment, the first color filter may include a blue color filter which selectively transmits blue light, and where the second color filter may include a red color filter which selectively transmits red light.

In an embodiment, the color filter layer may further include a third color filter disposed to fill the third opening.

In an embodiment, the third color filter is a green color filter which selectively transmits green light.

In an embodiment, the display device may further include a light control layer disposed between the light emitting device layer and the encapsulation layer and including an inorganic material.

In an embodiment, the inorganic material included in the light control layer may have a refractive index of about 1 or more for light in a wavelength range of about 380 nanometers (nm) to about 780 nm together with an absorption coefficient of about 0.5 or more for light in a wavelength range of about 380 nm to about 780 nm.

In an embodiment, the inorganic material included in the light control layer may include at least one selected from bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

In an embodiment, the first light emitting device, the second light emitting device, and the third light emitting device may include a quantum dot.

A display device according to an embodiment includes a substrate including a light emitting area and a light blocking area surrounding the light emitting area, a light emitting device layer disposed on the substrate and including a first light emitting device, a second light emitting device, and a third light emitting device, a light control layer disposed on the light emitting device layer and including an inorganic material, an encapsulation layer disposed on the light control layer, a light blocking member disposed in the light blocking area on the encapsulation layer and which defines a first opening overlapping the first light emitting device, a second opening overlapping the second light emitting device, and a third opening overlapping the third light emitting device, a color filter layer including a first color filter disposed to fill the first opening, a second color filter disposed to fill the second opening, and a third color filter disposed to fill the third opening, and an overcoat layer covering the light blocking member and the color filter layer and including an inorganic material or an organic material.

In an embodiment, the inorganic material included in the light control layer may have a refractive index of about 1 or more for light in a wavelength range of about 380 nm to about 780 nm together with an absorption coefficient of about 0.5 or more for light in a wavelength range of about 380 nm to about 780 nm.

In an embodiment, the inorganic material included in the light control layer may include at least one selected from bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

In an embodiment, the first light emitting device, the second light emitting device, and the third light emitting device may include a quantum dot.

A display device according to an embodiment includes a substrate including a light emitting area and a light blocking area surrounding the light emitting area, a light emitting device layer disposed on the substrate and including a first light emitting device, a second light emitting device, and a third light emitting device, a light control layer disposed on the light emitting device layer and including an inorganic material, an encapsulation layer disposed on the light control layer, a color filter layer disposed on the encapsulation layer and including a first color filter defining a first opening overlapping the first light emitting device and a second color filter defining a second opening overlapping the second light emitting device, and an antireflection layer covering the color filter layer and including at least one selected from a pigment and a dye.

In an embodiment, the first color filter and the second color filter may overlap each other in the light blocking area.

In an embodiment, the second color filter may be disposed to fill the first opening.

In an embodiment, the color filter layer may define a third opening overlapping the third light emitting device.

In an embodiment, the anti-reflection layer may be disposed to fill the third opening.

In an embodiment, the first color filter may include a blue color filter which selectively transmits blue light, and the second color filter may include a red color filter which selectively transmits blue light.

In an embodiment, the first light emitting device, the second light emitting device, and the third light emitting device may include a quantum dot.

The display device according to one or more embodiment may include a stacked layer including various combinations of the color filter layer together with the light control layer and/or the anti-reflection layer disposed on the light emitting device layer, which defines an in-cell polarizer of the display device, so that a separate polarizer may not be disposed. Accordingly, by omission of the separate polarizer, a weight and/or a thickness of the display device may be reduced. In addition, by the stacked layer including various combinations of the color filter layer together with the light control layer and/or the anti-reflection layer, external light reflectance of the display device may be improved and luminous efficiency may be improved. Accordingly, display quality of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present. When elements are "directly" related to each other, an interface may be formed therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Within the Figures and the text of the disclosure, a reference number indicating a singular form of an element may also be used to reference a plurality of the singular element.

For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1:
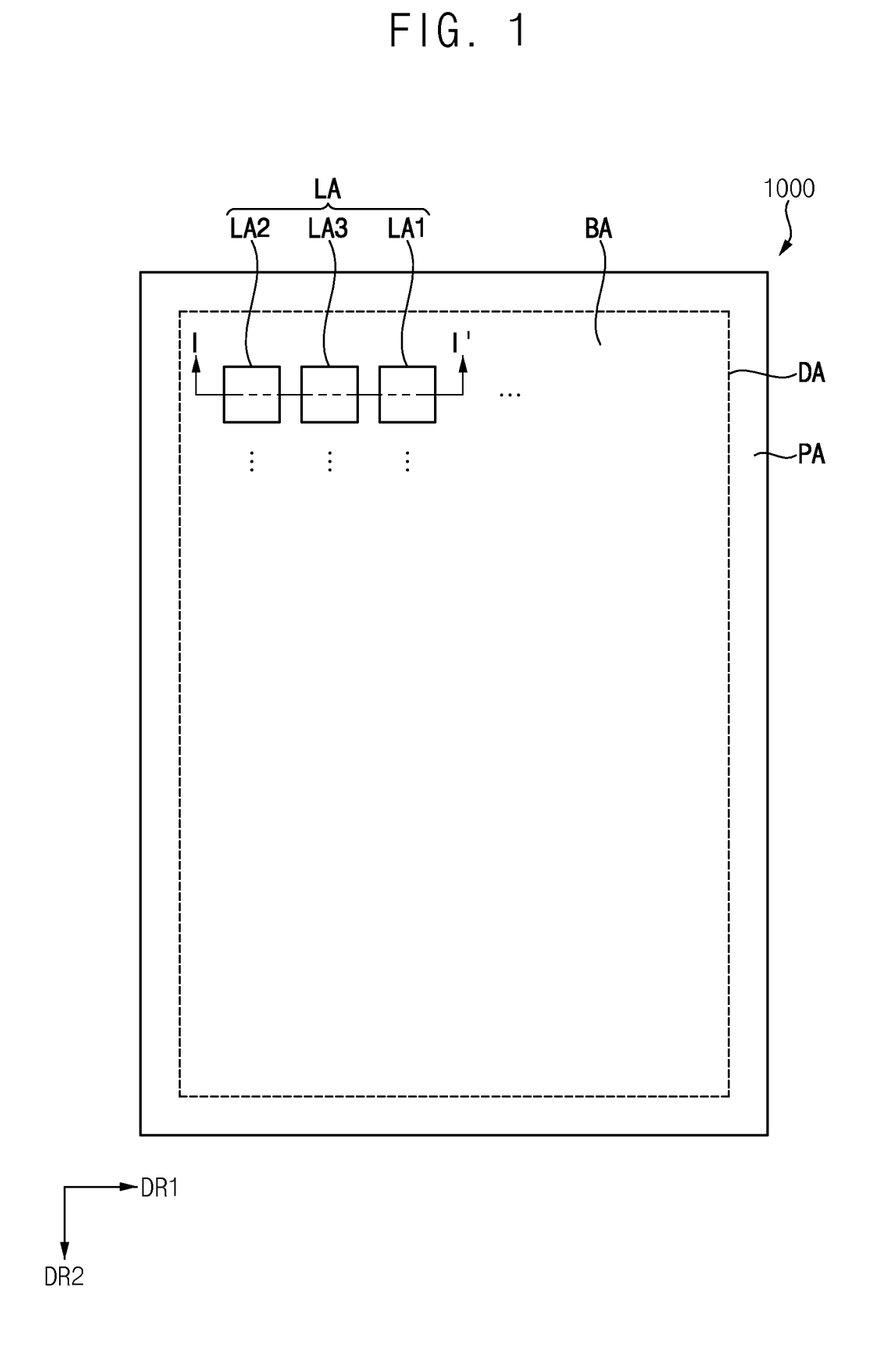
FIG. 1 is a plan view illustrating a display device according to an embodiment.

FIG. 1 is a plan view illustrating a display device 1000 according to an embodiment.

Referring to FIG. 1, a display device 1000 (or a substrate 110 of FIG. 2) according to an embodiment may include a display area DA and a peripheral area PA. The display area DA may be an area displaying an image, such as a planar area in which an image is displayed. The peripheral area PA may be an area not displaying an image, that is, a planar area in which an image is not displayed to define a non-display area. The peripheral area PA is adjacent to the display area DA. In an embodiment, the peripheral area PA may extend along on outer edge of the display area DA to be located around the display area DA. For example, the peripheral area PA may entirely surround the display area DA. A boundary may be defined between the display area DA and the peripheral area PA.

In an embodiment, the display area DA may include a light emitting area LA provided in plural including a plurality of light emitting areas LA, and a light blocking area BA adjacent to the light emitting area LA. For example, the display area DA may include a first light emitting area LA1, a second light emitting area LA2, and a third light emitting area LA3 as the plurality of light emitting areas LA (or a plurality of sub-light emitting areas). The light blocking area BA may surround the first light emitting area LA1, the second light emitting area LA2 and the third light emitting area LA3.

Each of the first light emitting area LA1, the second light emitting area LA2, and the third light emitting area LA3 may refer to an area (e.g., a planar area) in which light emitted from a light emitting device is emitted from the display device 1000 to outside of the display device 1000. For example, the first light emitting area LA1 may emit first light, the second light emitting area LA2 may emit second light, and the third light emitting area LA3 may emit third light. In an embodiment, the first light may be blue light, the second light may be red light, and the third light may be green light. However, the invention is not necessarily limited thereto. For example, the light emitting areas LA may be combined to emit yellow, cyan, and magenta lights.

The light emitting areas LA may emit light of four or more colors. For example, the light emitting areas LA may be combined to further emit at least one selected from yellow, cyan, and magenta lights in addition to red, green, and blue lights. Also, the light emitting areas LA may be combined to further emit white light.

In a plan view, each of the first light emitting area LA1, the second light emitting area LA2, and the third light emitting area LA3 may be repeatedly arranged along a row direction and a column direction. Specifically, in a plan view, the first light emitting area LA1, the second light emitting area LA2, and the third light emitting area LA3 may be repeatedly arranged along a first direction DR1 (e.g., a row direction) and a second direction DR2 (e.g., a column direction). The second direction DR2 crosses the first direction DR1 and may be orthogonal to the first direction DR1. However, the invention is not necessarily limited thereto, and in an embodiment, an arrangement structure of the first light emitting area LA1, the second light emitting area LA2, and the third light emitting area LA3 may be an S-stripe structure or arrangement. For example, the first light emitting area LA1 may be disposed in a first column, and the second light emitting area LA2 and the third light emitting area LA3 may be disposed in a second column which is adjacent to the first column. In other words, one side of each of the second light emitting area LA2 and the third light emitting area LA3 may be disposed to face a same long side of the first light emitting area LA1. In an embodiment, the arrangement structure of the first light emitting area LA1, the second light emitting area LA2, and the third light emitting area LA3 may be a pentile structure or arrangement.

Each of the first light emitting area LA1, the second light emitting area LA2, and the third light emitting area LA3 may have a triangular planar shape, a quadrangular planar shape, a circular planar shape, a track-shaped planar shape, an elliptical planar shape, or the like, in the plan view (e.g., a view along a third direction crossing the plane defined by the first direction DR1 and the second direction DR2 crossing each other). The third direction may define a thickness direction of the display device 1000 and various components or layers thereof. In an embodiment, as shown in FIG. 1, each of the first light emitting area LA1, the second light emitting area LA2, and the third light emitting area LA3 may have a rectangular planar shape. However, the invention is not limited thereto, and the first light emitting area LA1, the second light emitting area LA2, and the third light emitting area LA3 may have a different planar shape each other.

The light blocking area BA may be located respectively between the first light emitting area LA1, the second light emitting area LA2, and the third light emitting area LA3 which are spaced apart from each other. For example, in a plan view, the light blocking area BA may surround the first light emitting area LA1, the second light emitting area LA2, and the third light emitting area LA3. The light blocking area BA may be an area from which light is not emitted to the outside such as to define a non-light emitting area.

Various components or layers of the display device 1000 may include or define a display area DA, a peripheral area PA, a non-display area, a light emitting area LA, a light blocking area BA, etc. respectively corresponding to those described above.

Figure 2:
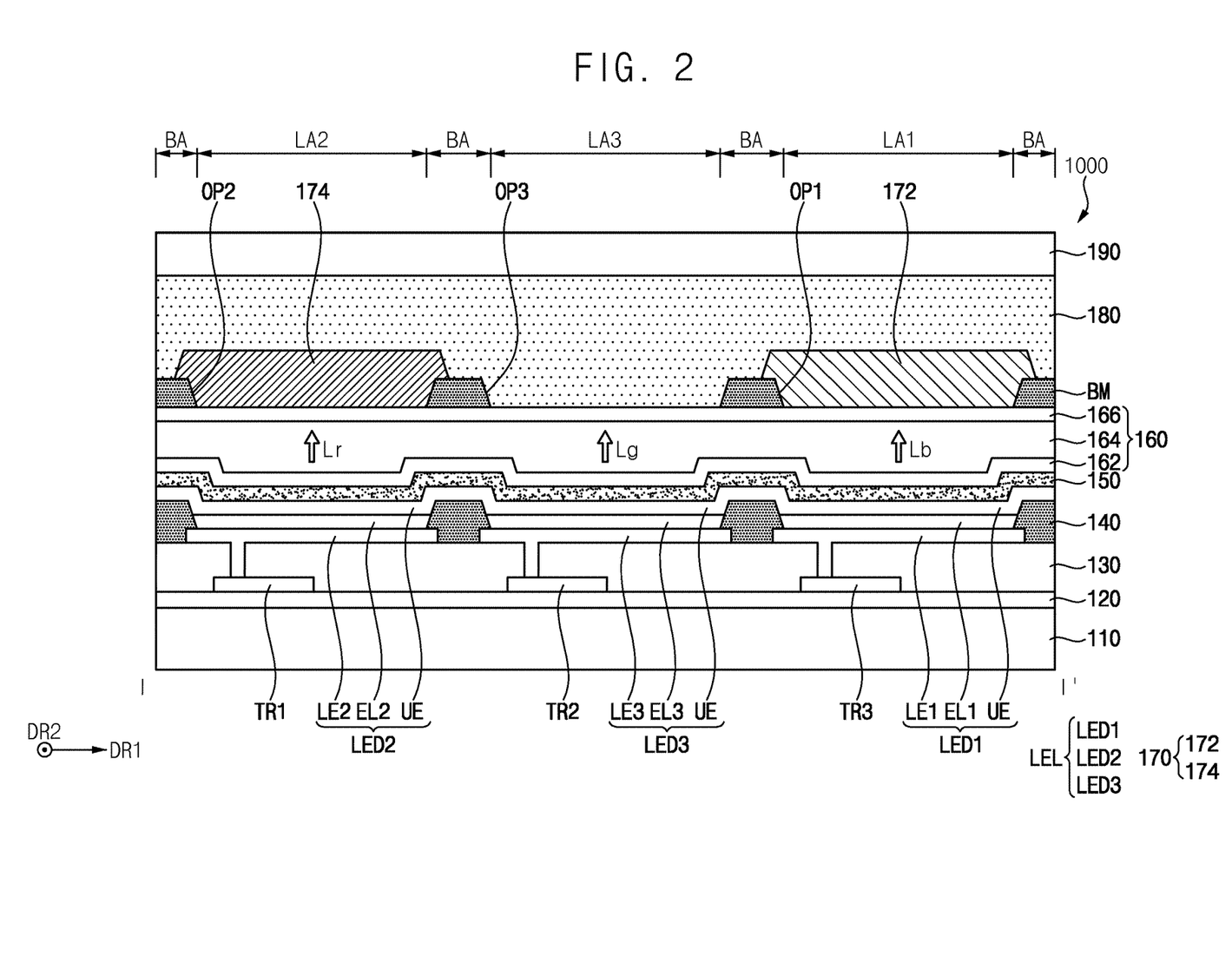
FIG. 2 is a cross-sectional view taken along line I-I' of FIG. 1.

FIG. 2 is a cross-sectional view taken along line I-I' of FIG. 1.

Referring to FIG. 2, the display device 1000 may include a substrate 110, a buffer layer 120, first to third driving elements TR1, TR2, and TR3, an insulating structure 130, a pixel defining layer 140, a light emitting device layer LEL, a light control layer 150, an encapsulation layer 160, a light blocking member BM or a light blocking pattern, a color filter layer 170, an anti-reflection layer 180, and a window 190. The light emitting device layer LEL may include a first light emitting device LED1, a second light emitting device LED2, and a third light emitting device LED3. The color filter layer 170 may include a first color filter 172 and a second color filter 174.

The substrate 110 may include a transparent material or an opaque material. In an embodiment, the substrate 110 may include a first organic layer, a first barrier layer, a second organic layer, a second barrier layer, or the like. Optionally, the substrate 110 may be a quartz substrate, a synthetic quartz substrate, a calcium fluoride substrate, an F-doped quartz substrate, a soda lime glass substrate, a non-alkali glass substrate, or the like. These may be used alone or in combination with each other.

The buffer layer 120 may be disposed on the substrate 110. The buffer layer 120 may prevent impurities such as oxygen and moisture from diffusing to an upper portion of the substrate 110, through the substrate 110. The buffer layer 120 may include an inorganic insulating material such as a silicon compound or a metal oxide. The buffer layer 120 may have a single-layer structure or a multi-layer structure including a plurality of insulating layers. In an embodiment, the buffer layer 120 may be omitted.

A circuit layer may include the first to third driving elements TR1, TR2, and TR3 may be disposed on the buffer layer 120. In an embodiment, each of the first to third driving elements TR1, TR2, and TR3 may include at least one thin film transistor. A channel layer of the transistor may include an oxide semiconductor, a silicon semiconductor, or an organic semiconductor. For example, the oxide semiconductor may include oxide of at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

The insulating structure 130 may cover the first to third driving elements TR1, TR2, and TR3. The insulating structure 130 as an insulating layer structure may include a combination of an inorganic insulating layer and an organic insulating layer. For example, the inorganic insulating layer may include silicon oxide (SiOx), silicon nitride (SiNx), silicon carbide (SiCx), silicon oxynitride (SiOxNy), silicon oxycarbide (SiOxCy), or the like. In addition, the organic insulating layer may include photoresist, polyacryl-based resin, polyimide-based resin, polyamide-based resin, siloxane-based resin, acrylic-based resin, epoxy-based resin, or the like. These may be used alone or in combination with each other.

First to third lower electrodes LE1, LE2, and LE3 may be disposed on the insulating structure 130. Each of the first to third lower electrodes LE1, LE2, and LE3 may include a conductive material such as a metal, an alloy, a conductive metal nitride, a conductive metal oxide, or a transparent conductive material. Each of the first to third lower electrodes LE1, LE2, and LE3 may have a single-layer structure or a multi-layer structure including a plurality of conductive layers.

The first to third lower electrodes LE1, LE2, and LE3 may be in a same layer as each other. A being in a same layer, elements may be formed in a same process and/or as including a same material as each other, elements may be respective portions or patterns of a same material layer, elements may be on a same layer by forming an interface with a same underlying or overlying layer, etc., without being limited thereto.

The first to third lower electrodes LE1, LE2, and LE3 may be electrically connected to the first to third driving elements TR1, TR2, and TR3 through contact holes formed in the insulating structure 130, respectively. That is, the circuit layer lay be connected to the light emitting device layer LEL, at various contact holes defined in or defined by the insulating layer structure.

The pixel defining layer 140 may be disposed on the first to third lower electrodes LE1, LE2, and LE3. The pixel defining layer 140 may include an organic insulating material. Examples of the organic insulating material that can be used as the pixel defining layer may include photoresist, polyacryl-based resin, polyimide-based resin, polyamide-based resin, siloxane-based resin, acrylic-based resin, epoxy-based resin, or the like. These may be used alone or in combination with each other.

The pixel defining layer 140 may include solid portions which are spaced apart from each other. The pixel defining layer 140 may define a pixel opening exposing at least a portion of each of the first to third lower electrodes LE1, LE2, and LE3 to outside the pixel defining layer 140. The solid portions (or material portions) of the pixel defining layer 140 may define the pixel opening therebetween. The light emitting areas LA and the light blocking area BA of the display device 1000 may be defined by the pixel opening. For example, the pixel opening is located may correspond to the light emitting areas LA and the solid portion of the pixel defining layer 140 which defines the pixel opening may correspond to the light blocking area BA.

First to third emission layers EL1, EL2, and EL3 may be disposed on the first to third lower electrodes LE1, LE2, and LE3 exposed by the pixel opening. For example, the first emission layer EL1 may be disposed on the first lower electrode LE1, the second emission layer EL2 may be disposed on the second lower electrode LE2, and the third emission layer EL3 may be disposed on the third lower electrode LE3. The various emission layers may be in a same layer as each other, without being limited thereto.

In an embodiment, the first emission layer EL1 may include a light emitting material which emits blue light Lb, and the second emission layer EL2 may include a light emitting material which emits red light Lr, the third emission layer EL3 may include a light emitting material which emits green light Lg. However, the invention is not necessarily limited thereto.

Specifically, each of the first emission layer EL1, the second emission layer EL2, and the third emission layer EL3 may include a quantum dot. Examples of materials that can be used as a core of the quantum dot may include group II-VI compounds, group III-VI compounds, group I-III-VI compounds, group III-V compounds, group III-II-V compounds, group I-IV-VI compounds, group IV elements, group IV compounds, or the like. These may be used alone or in combination with each other.

Examples of the group II-VI compounds may include a binary compound selected from the group consisting of CdSe, CdTe, CdS, ZnS, ZnSe, ZnTe, ZnO, HgS, HgSe, HgTe, MgSe, MgS, and combinations thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and combinations thereof; and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and combinations thereof. These may be used alone or in combination with each other.

Examples of the group III-VI compounds may include a binary compound such as In2S3 and In2Se3 and a ternary compound such as InGaS3 and InGaSe3. These may be used alone or in combination with each other.

Examples of the group I-III-VI compounds may include a ternary compound selected from the group consisting of AgInS, AgInS2, CuInS, CuInS2, AgGaS2, CuGaS2, CuGaO2, AgGaO2, AgA102, and combinations thereof; and a quaternary compound such as AgInGaS2, CuInGaS2, or the like. These may be used alone or in combination with each other.

Examples of the group III-V compounds may include a binary compound selected from the group consisting of GaN, GaP, GaAs, GaSb, AN, AlP, AlAs, AlSb, InN, InP, InAs, InSb, and combinations thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and combinations thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and combinations thereof. These may be used alone or in combination with each other. The group III-V compounds may further include a group II metal. For example, InZnP or the like may be selected as the group III-II-V compounds.

Examples of the IV-VI compounds may include a binary compound selected from the group consisting of SnS, SnSe, SnTe, PbS, PbSe, PbTe, and combinations thereof; a ternary compound selected from the group consisting of SnSeS, SnSeTe, SnSTe, PbSeS, PbSeTe, PbSTe, SnPbS, SnPbSe, SnPbTe, and combinations thereof; and a quaternary compound selected from the group consisting of SnPbSSe, SnPbSeTe, SnPbSTe, and combinations thereof. These may be used alone or in combination with each other. Examples of the group IV elements may include Si and Ge. These may be used alone or in combination with each other. Examples of the group IV compounds may include SiC and SiGe. These may be used alone or in combination with each other.

In this case, a binary compound, a ternary compound, or a quaternary compound may be present in a particle at a uniform concentration or may be present in a same particle in a state in which a concentration distribution is partially different. Also, one quantum dot may have a core/shell structure surrounding another quantum dot. In the core/shell structure, the quantum dot may have a concentration gradient in which a concentration of elements in the shell decreases toward the core.

In embodiments, the quantum dot may have a core-shell structure including a core including the aforementioned nanocrystal and a shell surrounding the core. The shell of the quantum dot may serve as a protective layer for maintaining semiconductor properties by preventing chemical denaturation of the core and/or as a charging layer for imparting electrophoretic properties to the quantum dot. The shell may be a single-layer or a multi-layer. Examples of the shell of quantum dot may include metal oxide, non-metal oxide, semiconductor compound, or combinations thereof.

Examples of the metal or non-metal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, of the like; or $MgAl_2O_4$, $CoFe_2O_4$, $NiFe_2O_4$, $CoMn_2O_4$. However, the invention is not necessarily limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, the invention is not necessarily limited thereto.

The quantum dots may have a full width of half maximum (FWHM) of an emission wavelength spectrum of about 45 nanometers (nm) or less, such as about 40 nm or less or about 30 nm or less, and color purity or color reproducibility can be improved in that range. In addition, since light emitted through the quantum dots is emitted in all directions, a wide viewing angle may be improved.

The quantum dots may control a color of light emitted according to a particle size, and thus, the quantum dots may have various luminous colors such as blue, red, and green. For example, an emission color of the quantum dots included in the first emission layer EL1 may be blue light Lb, an emission color of the quantum dots included in the second emission layer EL2 may be red light Lr, and an emission color of the quantum dots included in the third emission layer EL3 may be green light Lg.

In an embodiment, functional layers such as a hole injection layer, a hole transport layer, an electron transport layer, and an electron injection layer may be disposed above and/or below each of the first to third emission layers EL1, EL2, and EL3.

An upper electrode UE may be disposed on the first to third emission layers EL1, EL2, and EL3. The upper electrode UE may include a conductive material such as a metal, an alloy, a conductive metal nitride, a conductive metal oxide, or a transparent conductive material. The upper electrode UE may have a single-layer structure or a multi-layer structure including a plurality of conductive layers. In an embodiment, the upper electrode UE may continuously extend over a plurality of pixels.

The first lower electrode LE1, the first emission layer EL1, and the upper electrode UE may together constitute a light emitting element such as the first light emitting device LED1. The second lower electrode LE2, the second emission layer EL2, and the upper electrode UE may constitute a light emitting element such as the second light emitting device LED2. The third lower electrode LE3, the third emission layer EL3, and the upper electrode UE may together constitute a light emitting element such as the third light emitting device LED3. The light emitting devices may be considered coplanar with the pixel defining layer 140. The light emitting devices together with the pixel defining layer 140 may together define the light emitting device layer LEL, without being limited thereto.

In an embodiment, the first light emitting device LED1 may emit blue light Lb, the second light emitting device LED2 may emit red light Lr, and the third light emitting device LED3 may emit green light Lg. However, the invention is not necessarily limited thereto. The first light emitting device LED1, the second light emitting device LED2, and the third light emitting device LED3 may constitute the light emitting device layer LEL.

Although a quantum dot display device is limitedly described as the display device 1000, the disclosure is not necessarily limited thereto. In other embodiments, the display device 1000 may be a liquid crystal display device (LCD), an organic light emitting display device (OLED), a field emission display device (FED), a plasma display device (PDP), an electrophoretic display device (EPD), or an inorganic light emitting display device (ILED). The various display devices may respectively include a light emitting element other than the light emitting device described above including the upper and lower electrodes with a light emitting layer (e.g., a light emission layer) therebetween.

The light control layer 150 may be disposed on the light emitting device layer LEL. For example, the light control layer 150 may be disposed on the upper electrode UE. In an embodiment, the light control layer 150 may be disposed to continuously extend on the upper electrode UE. In an embodiment, the light control layer 150 may be disposed in each of the first to third light emitting areas LA1, LA2, and LA3.

In an embodiment, the light control layer 150 may include an inorganic material. For example, the light control layer 150 may include an inorganic material having low reflectivity and may be otherwise referred to as an inorganic light control layer.

In an embodiment, the inorganic material included in the light control layer 150 may have a refractive index of about 1 or more for light in a wavelength range of about 380 nm to about 780 nm, together with an absorption coefficient of about 0.5 or greater for light in a wavelength range of about 380 nm to about 780 nm. More specifically, the refractive index of the inorganic material included in the light control layer 150 may be about 1 to about 5, together with the absorption coefficient of the inorganic material included in the light control layer 150 may be about 0.5 to about 10.

Examples of the inorganic material that can be used as the light control layer 150 may include bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or the like. These may be used alone or in combination with each other.

The light control layer 150 may absorb light incident into the display device 1000 as a light absorbing layer. In addition, the light control layer 150 may block or reduce light traveling toward the outside of the display device 1000 by inducing destructive interference of light. Accordingly, the light control layer 150 may reduce or prevent external light reflectance of the display device 1000. Accordingly, display quality of the display device 1000 may be improved.

In an embodiment, a capping layer (not shown) may be further disposed between the light emitting device layer LEL and the light control layer 150. For example, the capping layer may be entirely formed on the upper electrode UE. The capping layer may protect the upper electrode UE. In an embodiment, the capping layer may be formed using an inorganic material and/or an organic material.

The encapsulation layer 160 may be disposed on the light control layer 150. For example, the encapsulation layer 160 may be disposed on the upper electrode UE. The encapsulation layer 160 may include at least one inorganic encapsulation layer and at least one organic encapsulation layer. In an embodiment, the encapsulation layer 160 may include a first inorganic encapsulation layer 162 disposed on the upper electrode UE, an organic encapsulation layer 164 disposed on the first inorganic encapsulation layer 162, and a second inorganic encapsulation layer 166 disposed on the organic encapsulation layer 164.

The light blocking member BM may be disposed on the encapsulation layer 160. In an embodiment, the light blocking member BM may entirely overlap the light blocking area BA (e.g., may overlap an entirety of the light blocking area BA) and may have a grid shape in a plan view. In other words, solid material portions of the light blocking member BM may overlap or correspond to solid material portions the pixel defining layer 140, respectively.

In an embodiment, the light blocking member BM may absorb external light. Accordingly, the light blocking member BM may reduce or prevent the external light reflectance of the display device 1000. Examples of materials that can be used as the light blocking member BM may include chromium (Cr), chromium oxide (CrOx), chromium nitride (CrNx), carbon black, a black pigment combination, a black dye combination, or the like. These may be used alone or in combination with each other.

In an embodiment, as a light blocking layer, the light blocking member BM as a solid portion may define a plurality of openings which expose a portion of the encapsulation layer 160 to outside the light blocking layer. For example, the light blocking member BM may define a first opening OP1 overlapping the first light emitting device LED1, a second opening OP2 overlapping the second light emitting device LED2, and a third opening OP3 overlapping the third light emitting device LED3. In other words, the first opening OP1 may correspond to the first light emitting device LED1, the second opening OP2 may correspond to the second light emitting device LED2, and the third opening OP3 may correspond to the third light emitting device LED3.

The color filter layer 170 may be disposed on the encapsulation layer 160 on which the light blocking member BM is disposed. In an embodiment, solid material portions of the color filter layer 170 may partially overlap solid portions of the light blocking member BM.

In one embodiment, the color filter layer 170 may include a first color filter 172 and a second color filter 174 as solid portions of the color filter layer 170. In an embodiment, the first color filter 172 and the second color filter 174 may be spaced apart from each other, such as to define a gap therebetween.

In an embodiment, each of the first color filter 172 and the second color filter 174 may transmit light of a specific color and block light of a color other than the specific color. For example, the first color filter 172 and the second color filter 174 may include a pigment and/or a dye which absorb light of a color other than the specific color.

In an embodiment, the first color filter 172 may be disposed to fill the first opening OP1, and the second color filter 174 may be disposed to fill the second opening OP2. In other words, the first color filter 172 may correspond to the first light emitting device LED1, and the second color filter 174 may correspond to the second light emitting device LED2. The color filters and the light blocking member BM be considered coplanar with each other, and may together define a color control layer, without being limited thereto.

In this case, light emitted from the first light emitting device LED1 and passing through the first color filter 172 may correspond to light emitted from the first light emitting area LA1. In addition, light emitted from the second light emitting device LED2 and passing through the second color filter 174 may correspond to light emitted from the second light emitting area LA2.

In an embodiment, color of light selectively transmitted by each of the first color filter 172 and the second color filter 174 may be determined corresponding to color of light emitted by each of the first and second light emitting devices LED1 and LED2. For example, as shown in FIG. 2, the first light emitting device LED1 may emit blue light Lb and the second light emitting device LED2 may emit red light Lr, the first color filter 172 may be a blue color filter which selectively transmits blue light Lb, and the second color filter 174 may be a red color filter which selectively transmits red light Lr.

In this case, the first color filter 172 may include a pigment and/or a dye absorbing light of a color other than blue, and the second color filter 174 may include a pigment and/or a dye absorbing light of a color other than red.

The anti-reflection layer 180 may be disposed on the light blocking member BM and the color filter layer 170. For example, the anti-reflection layer 180 may cover the light blocking member BM and the color filter layer 170.

In an embodiment, the anti-reflection layer 180 may be disposed to fill the third opening OP3. That is, the anti-reflection layer 180 may extend along upper surfaces of the light blocking member BM and the color filter layer 170, and along sidewalls of the light blocking member BM and the color filter layer 170 to be in the third opening OP3. Herein, a sidewall of a layer may define a respective opening therein, and an upper surface may be a surface which is furthest from the substrate 110, without being limited thereto. In this case, light emitted from the third light emitting device LED3 and passing through the anti-reflection layer 180 may correspond to light emitted from the third light emitting area LA3.

The anti-reflection layer 180 may include an inorganic material and/or an organic material. In an embodiment, the anti-reflection layer 180 may include an organic material. For example, the anti-reflection layer 180 may include an organic material such as photoresist, polyacrylic resin, polyimide resin, polyamide resin, siloxane resin, acrylic resin, and epoxy resin. These may be used alone or in combination with each other.

In an embodiment, the anti-reflection layer 180 may include a pigment and/or a dye which absorb light of a color other than a specific color.

Examples of a pigment that can be used as the anti-reflection layer 180 may include a red pigment, a yellow pigment, a green pigment, and a blue pigment. These may be used alone or in combination with each other.

The red pigment may include a red pigment or a reddish pigment. For example, the red pigment may include a known C.I. Pigment red-based pigment. The yellow pigment may include a yellow pigment or a yellowish pigment. For example, the yellow pigment may include a known C.I. Pigment yellow-based pigment. The green pigment may include a green pigment or a greenish pigment. For example, the green pigment may include a known C.I. Pigment green-based pigment. The blue pigment may include a blue pigment or a blueish pigment. For example, the blue pigment may include a known C.I. Pigment blue-based pigment. In addition, the anti-reflection layer 180 may further include a black pigment.

Examples of the dye that can be used as the anti-reflection layer 180 may include tetraazaporphyrin-based dye, cyanine-based dye, squaraine-based dye, oxazine-based dye, porphyrin-based dye, triarylmethane-based dye, polymethine-based dye, anthraquine-based dye, phthalocyanine-based dye, azo-based dye, perylene-based dye, xanthene-based dye, diimonium-based dye, or the like. These may be used alone or in combination with each other.

Since the light control layer 150 may absorb light incident into the display device 1000 as a light absorbing layer to reduce or prevent external light reflectance of the display device 1000, the display device 1000 may include a plurality of light absorbing layers or a plurality of anti-reflection layers, namely the light control layer 150 and the anti-reflection layer 180.

According to embodiments, color of light emitted from the first to third light emitting devices LED1, LED2, and LED3 may be more distinctly recognized as the colored lights pass through the color filter layer 170 and the anti-reflection layer 180.

The window 190 may be disposed on the anti-reflection layer 180. In an embodiment, examples of materials that can be used as the window 190 may include glass, quartz, plastic, or the like. These may be used alone or in combination with each other. The window 190 may protect the above-described components from external forces.

According to embodiments, the display device 1000 may include the light blocking member BM, the color filter layer 170 and the anti-reflection layer 180, so that a separate polarizer may not be disposed. That is, the light blocking member BM, the color filter layer 170 and the anti-reflection layer 180 may together function as the polarizer to define an in-cell polarizer. Accordingly, a weight and/or a thickness of the display device 1000 may be reduced. Also, visibility of the display device 1000 may be improved. Accordingly, display quality of the display device 1000 may be improved. That is, the light blocking member layer (e.g., the light blocking members BM defining openings therebetween), the color filter layers spaced apart from each other along the substrate 110, and the anti-reflection layer 180 together with each other, may defined a stacked structure which functions as a polarizer.

Figure 3:
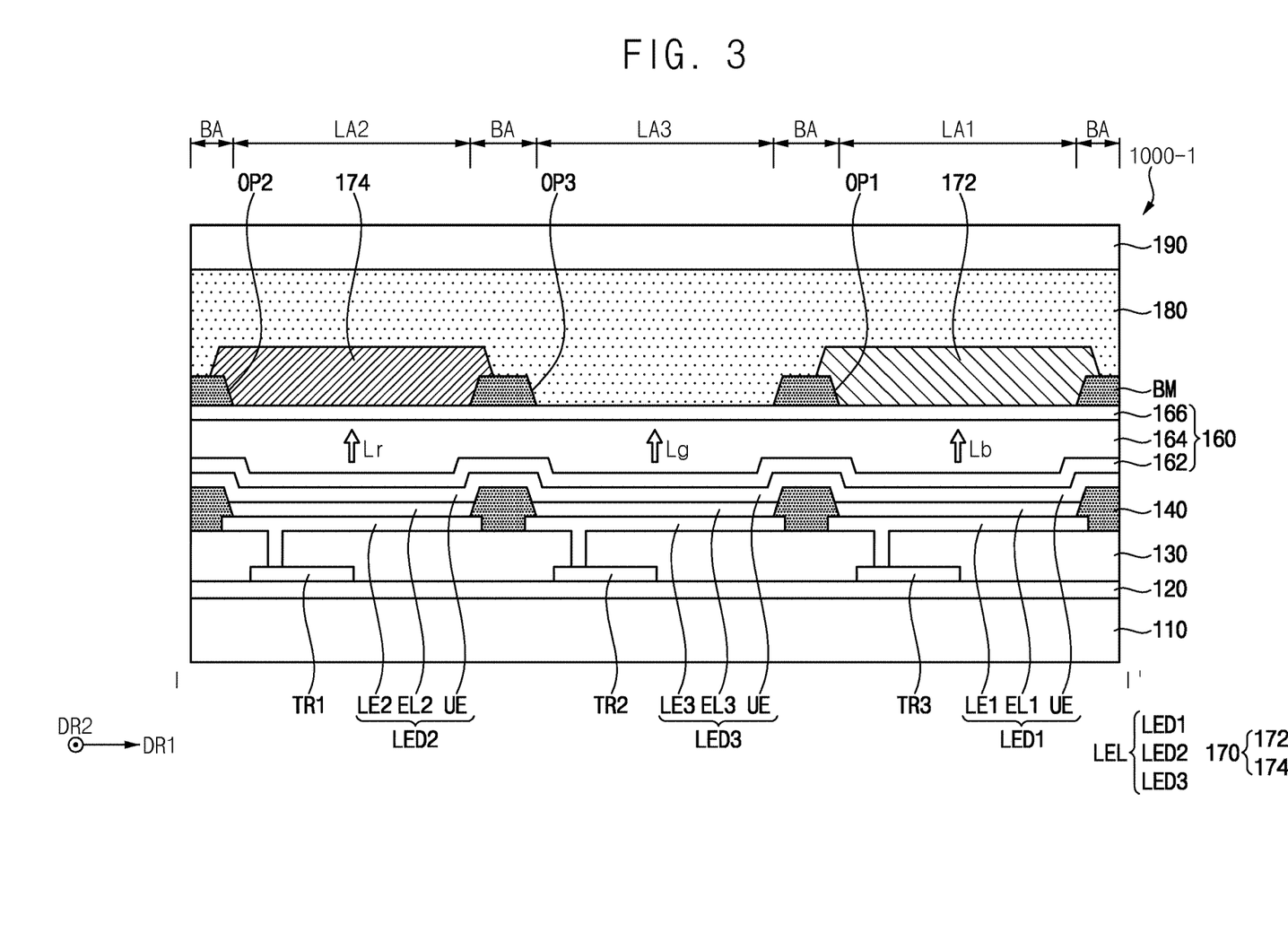
FIG. 3 is a cross-sectional view illustrating a display device according to an embodiment.

FIG. 3 is a cross-sectional view illustrating a display device 1000-1 according to an embodiment.

Referring to FIG. 3, the display device 1000-1 may include the substrate 110, the buffer layer 120, the first to third driving elements TR1, TR2, and TR3, the insulating structure 130, the pixel defining layer 140, the light emitting device layer LEL, the encapsulation layer 160, the light blocking member BM, the color filter layer 170, the anti-reflection layer 180, and the window 190. However, the display device 1000-1 may be substantially the same as the display device 1000 described with reference to FIG. 2 except that the light control layer 150 is omitted. Therefore, repeated descriptions will be omitted.

In an embodiment, the light control layer 150 may be omitted. In this case, the encapsulation layer 160 may be disposed on the upper electrode UE. In an embodiment, the encapsulation layer 160 may be directly on the upper electrode UE, such as to form an interface therebetween. Although not shown, the capping layer described above may be disposed between the light emitting device layer LEL and the encapsulation layer 160.

Figure 4:
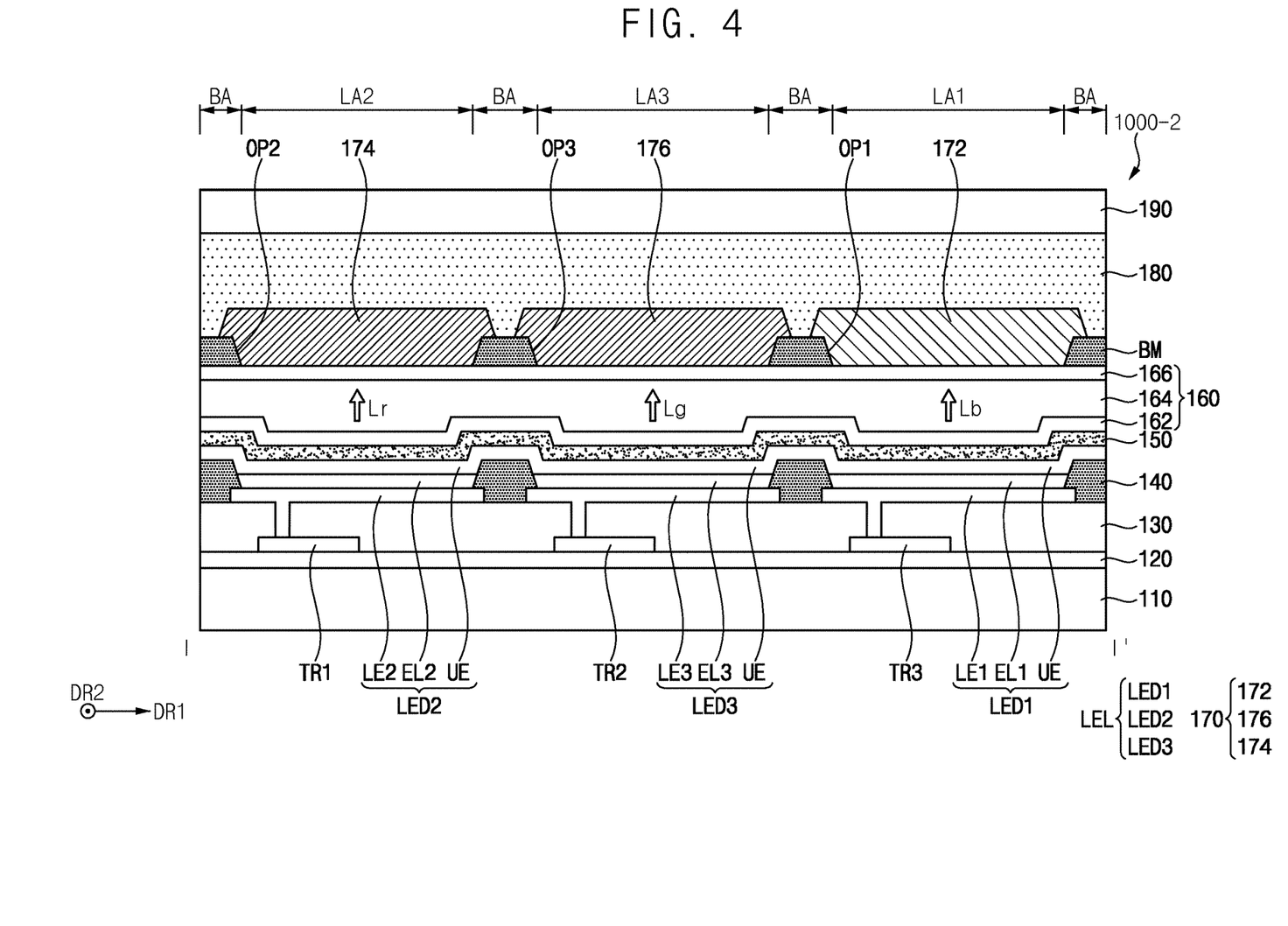
FIG. 4 is a cross-sectional view illustrating a display device according to an embodiment.

FIG. 4 is a cross-sectional view illustrating a display device 1000-2 according to an embodiment.

Referring to FIG. 4, the display device 1000-2 may include the substrate 110, the buffer layer 120, the first to third driving elements TR1, TR2, and TR3, the insulating structure 130, the pixel defining layer 140, the light emitting device layer LEL, the light control layer 150, the encapsulation layer 160, the light blocking member BM, the color filter layer 170, the anti-reflection layer 180, and the window 190. However, the display device 1000-2 may be substantially the same as the display device 1000 described with reference to FIG. 2 except for a configuration of the color filter layer 170. Therefore, repeated descriptions will be omitted.

In an embodiment, the color filter layer 170 may further include a third color filter 176. That is, the color filter layer 170 may include the first color filter 172, the second color filter 174 and the third color filter 176.

The third color filter 176 may transmit light of a specific color and block light of a color other than the specific color. For example, the third color filter 176 may include a pigment and/or a dye that absorb light of a color other than the specific color.

In an embodiment, the third color filter 176 may be disposed to fill the third opening OP3. In other words, the third color filter 176 may correspond to the third light emitting device LED3. In this case, light emitted from the third light emitting device LED3 and passing through the third color filter 176 may correspond to light emitted from the third light emitting area LA3.

In an embodiment, the first color filter 172, the second color filter 174, and the third color filter 176 may be spaced apart from each other in a direction along the circuit layer (or the substrate 110). However, the invention is not necessarily limited thereto, and in an embodiment, each of the first color filter 172, the second color filter 174, and the third color filter 176 may partially overlap each other on the light blocking member BM. One or more of the color filters which in an opening of the light blocking member BM, may extend out of the respective opening and further from the substrate 110 than solid portions of the light blocking member BM.

In an embodiment, the color of light selectively transmitted by each of the first color filter 172, the second color filter 174, and the third color filter 176 may be determined corresponding to color of light emitted by each of the first to third light emitting devices LED1, LED2, LED3. For example, as shown in FIG. 4, the first light emitting device LED1 may emit blue light Lb, the second light emitting device LED2 may emit red light Lr, the third light emitting device LED3 may emit green light Lg, the first color filter 172 may be a blue color filter which selectively transmits blue light Lb, the second color filter 174 may be a red color filter which selectively transmits a red light Lr, and the third color filter 176 may be a green color filter which selectively transmits green light Lg.

In this case, the first color filter 172 may include a pigment and/or a dye absorbing light of a color other than blue, the second color filter 174 may include a pigment and/or a dye absorbing light of a color other than red, and the third color filter 176 may include a pigment and/or a dye absorbing light of a color other than green.

According to embodiments, the display device 1000-2 may include the light blocking member BM, the color filter layer 170 and the anti-reflection layer 180, and the color filter layer 170 may include first to third color filters 172, 174, and 176 which selectively transmit light of different colors each other. Accordingly, display quality of the display device 1000-2 may be further improved.

Figure 5:
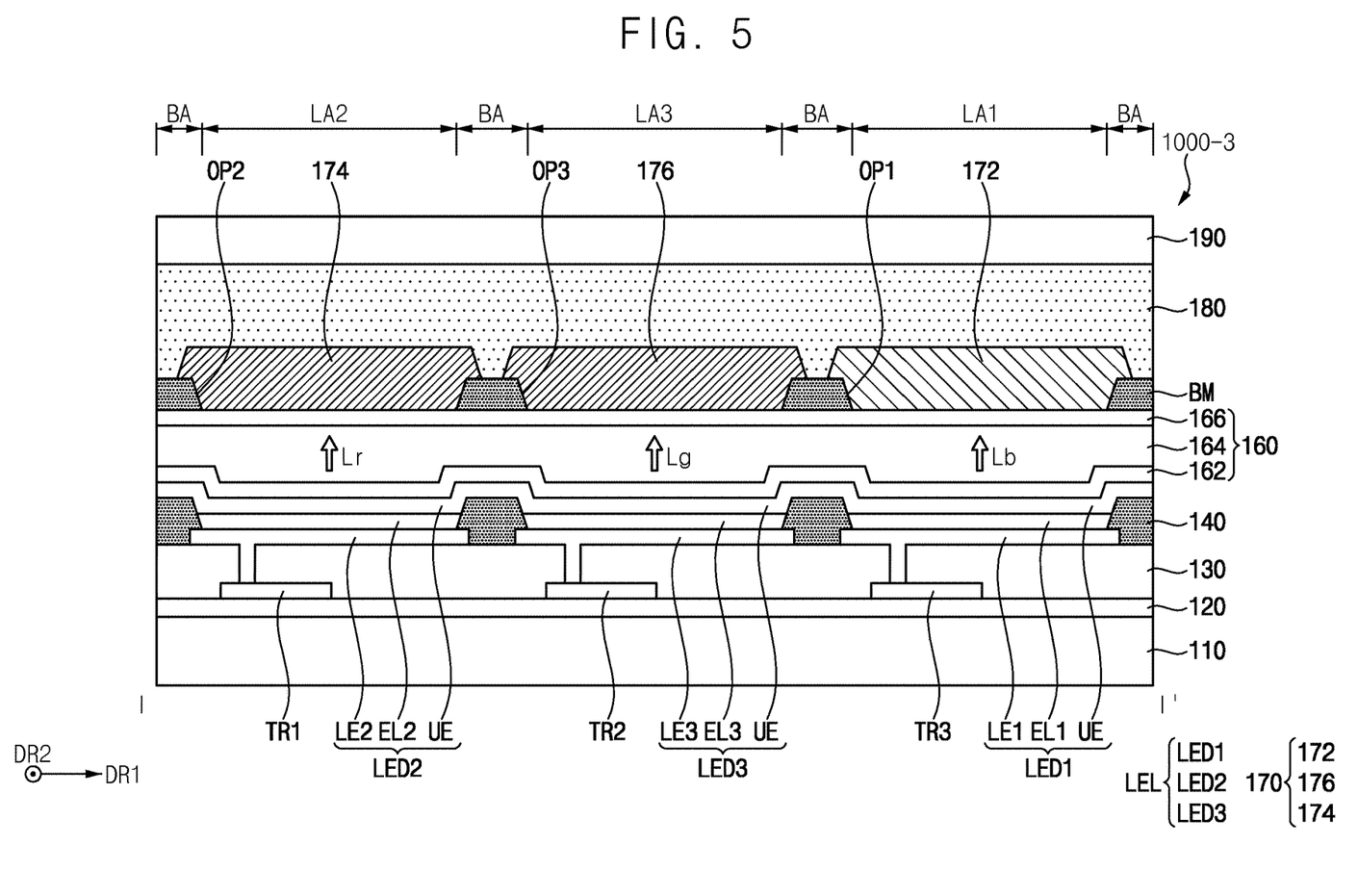
FIG. 5 is a cross-sectional view illustrating a display device according to an embodiment.

FIG. 5 is a cross-sectional view illustrating a display device 1000-3 according to an embodiment.

Referring to FIG. 5, the display device 1000-3 may include the substrate 110, the buffer layer 120, the first to third driving elements TR1, TR2, and TR3, the insulating structure 130, the pixel defining layer 140, the light emitting device layer LEL, the light control layer 150, the encapsulation layer 160, the light blocking member BM, the color filter layer 170, the anti-reflection layer 180, and the window 190. However, the display device 1000-3 may be substantially the same as the display device 1000-2 described with reference to FIG. 4 except that the light control layer 150 is omitted. Therefore, repeated descriptions will be omitted.

In an embodiment, even when the color filter layer 170 includes the first to third color filters 172, 174, and 176, the light control layer 150 may be omitted. In this case, the encapsulation layer 160 may be disposed on the upper electrode UE. In an embodiment, the encapsulation layer 160 may be directly on the upper electrode UE, such as to form an interface therebetween. Although not shown, the capping layer may be disposed between the light emitting device layer LEL and the encapsulation layer 160.

Figure 6:
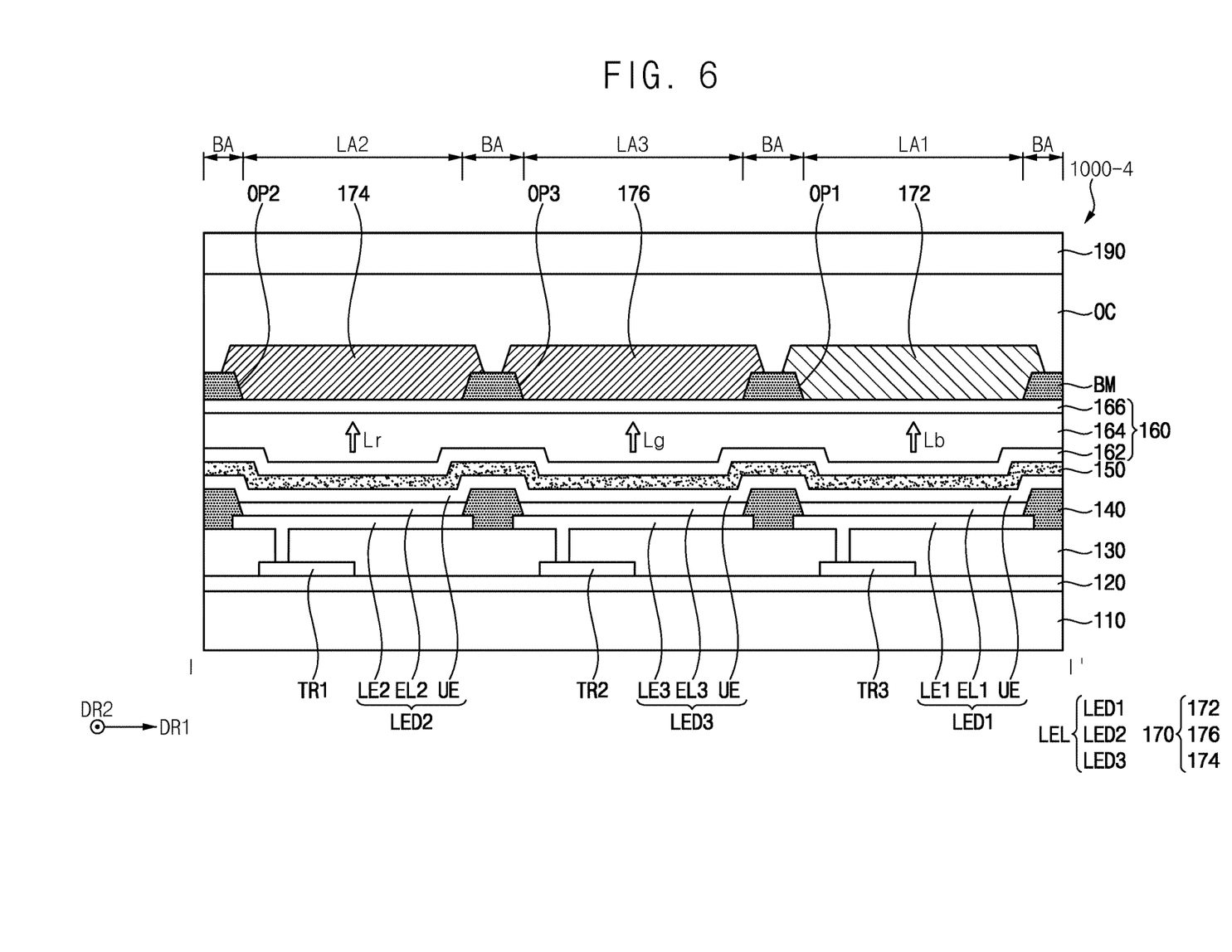
FIG. 6 is a cross-sectional view illustrating a display device according to an embodiment.

FIG. 6 is a cross-sectional view illustrating a display device 1000-4 according to an embodiment.

Referring to FIG. 6, the display device 1000-4 may include the substrate 110, the buffer layer 120, the first to third driving elements TR1, TR2, and TR3, the insulating structure 130, the pixel defining layer 140, the light emitting device layer LEL, the light control layer 150, the encapsulation layer 160, the light blocking member BM, the color filter layer 170, the window 190, and the overcoat layer OC. However, the display device 1000-4 may be substantially the same as the display device 1000-1 described with reference to FIG. 3 except that the anti-reflection layer 180 is omitted and the overcoat layer OC is included in place of the anti-reflection layer 180. Therefore, repeated descriptions will be omitted.

In an embodiment, the overcoat layer OC may be disposed on the light blocking member BM and the color filter layer 170. For example, the overcoat layer OC may cover the light blocking member BM and the color filter layer 170.

In an embodiment, the overcoat layer OC may include an inorganic material or an organic material. For example, the overcoat layer OC may include an organic material. Examples of organic materials that can be used as the overcoat layer OC may include photoresist, polyacrylic resin, polyimide resin, acrylic resin, epoxy resin, acrylate resin, or the like. These may be used alone or in combination with each other.

According to embodiments, as the display device 1000-4 includes the light control layer 150, the light blocking member BM, the color filter layer 170, and the overcoat layer OC, and the color filter layer 170 includes the first to third color filters 172, 174, and 176, a separate polarizer may not be disposed. That is, the light control layer 150, the light blocking member BM, the color filter layer 170, and the overcoat layer OC may together function as the polarizer to define an in-cell polarizer. Accordingly, visibility of the display device 1000-4 may be improved. Accordingly, display quality of the display device 1000-4 may be improved. That is, the light control layer 150, the light blocking member layer (e.g., the light blocking members BM defining openings therebetween), the first to third color filters 172, 174, and 176 spaced apart from each other along the substrate 110, and the overcoat layer OC together with each other, may defined a stacked structure which functions as a polarizer.

Figure 7:
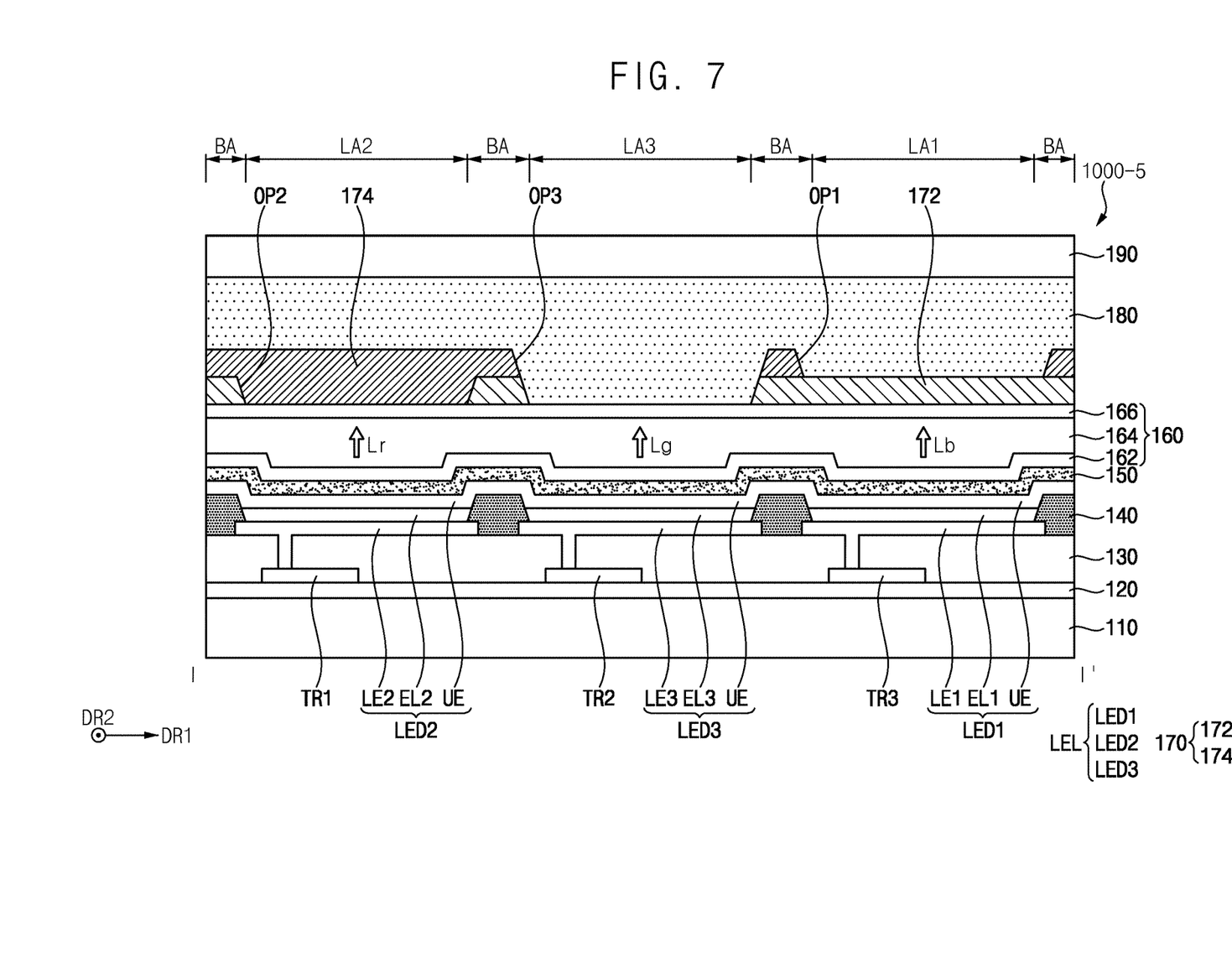
FIG. 7 is a cross-sectional view illustrating a display device according to an embodiment.

FIG. 7 is a cross-sectional view illustrating a display device 1000-5 according to an embodiment.

Referring to FIG. 7, the display device 1000-5 may include the substrate 110, the buffer layer 120, the first to third driving elements TR1, TR2, and TR3, the insulating structure 130, the pixel defining layer 140, the light emitting device layer LEL, the light control layer 150, the encapsulation layer 160, the light blocking member BM, the color filter layer 170, the anti-reflection layer 180, and the window 190. However, the display device 1000-5 may be substantially the same as the display device 1000 described with reference to FIG. 2 except that the light blocking member BM is omitted and a configuration and a structure of the color filter layer 170 are changed. Therefore, redundant descriptions are omitted. Therefore, repeated descriptions will be omitted.

In an embodiment, the color filter layer 170 may include the first color filter 172 and the second color filter 174, and extended portions of each of the first color filter 172 and the second color filter 174 may be disposed to further overlap the light blocking area BA.

That is, the first color filter 172 may overlap the first light emitting area LA1 and the light blocking area BA, and may not overlap the second light emitting area LA2 and the third light emitting area LA3. The second color filter 174 may overlap the second light emitting area LA2 and the light blocking area BA, and may not overlap the first light emitting area LA1 and the third light emitting area LA3. As not overlapping, elements may be adjacent to each other, may be spaced apart from each other, and the like.

Accordingly, portions or patterns of the first color filter 172 may define the second opening OP2 overlapping the second light emitting device LED2. Portions of patterns of the second color filter 174 may define the first opening OP1 overlapping the first light emitting device LED1. In this case, the second color filter 174 may be disposed to fill the second opening OP2 defined by the first color filter 172.

Also, stacked portions of the first color filter 172 and the second color filter 174 may define a third opening OP3 overlapping the third light emitting device LED3. That is, overlapping portions of the color filter layer 170 may define the third opening OP3 overlapping the third light emitting device LED3. Herein, the anti-reflection layer 180 may be disposed to fill the third opening OP3. A portion of a color filter which extends from a light emitting area LA and corresponds to the light blocking area BA may be an extended portion of the color filter.

In this case, light emitted from the first light emitting device LED1 and passing through the first color filter 172 may correspond to light emitted from the first light emitting area LA1. In addition, light emitted from the second light emitting device LED2 and passing through the second color filter 174 may correspond to light emitted from the second light emitting area LA2. In addition, light emitted from the third light emitting device LED3 and passing through the anti-reflection layer 180 may correspond to light emitted from the third light emitting area LA3.

In an embodiment, the first light emitting device LED1 may emit blue light Lb, the second light emitting device LED2 may emit red light Lr, and the third light emitting device LED3 may emit green light Lg, the first color filter 172 may be a blue color filter which selectively transmits blue light Lb, and the second color filter 174 may be a red color filter which selectively transmits red light Lr.

In this case, the first color filter 172 may include a pigment and/or a dye absorbing light of a color other than blue, and the second color filter 174 may include a pigment and/or a dye absorbing light of a color other than red.

According to embodiments, portions of the first color filter 172 and the second color filter 174 may overlap each other in the light blocking area BA. A light blocking member BM may be defined by extended portions of the color filter layer 170 which are stacked. That is, the light blocking members (e.g., stacked extended portions of the color filter layer 170), the color filter layer, and the anti-reflection layer 180 together with each other, may defined a stacked structure which functions as a polarizer. Accordingly, color mixing between adjacent first to third light emitting areas LA1, LA2, and LA3 may be reduced or prevented. Accordingly, a process for forming a separate light blocking member BM may not be required. Accordingly, a process of manufacturing or providing the display device 1000-5 can be further simplified.

Figure 8:
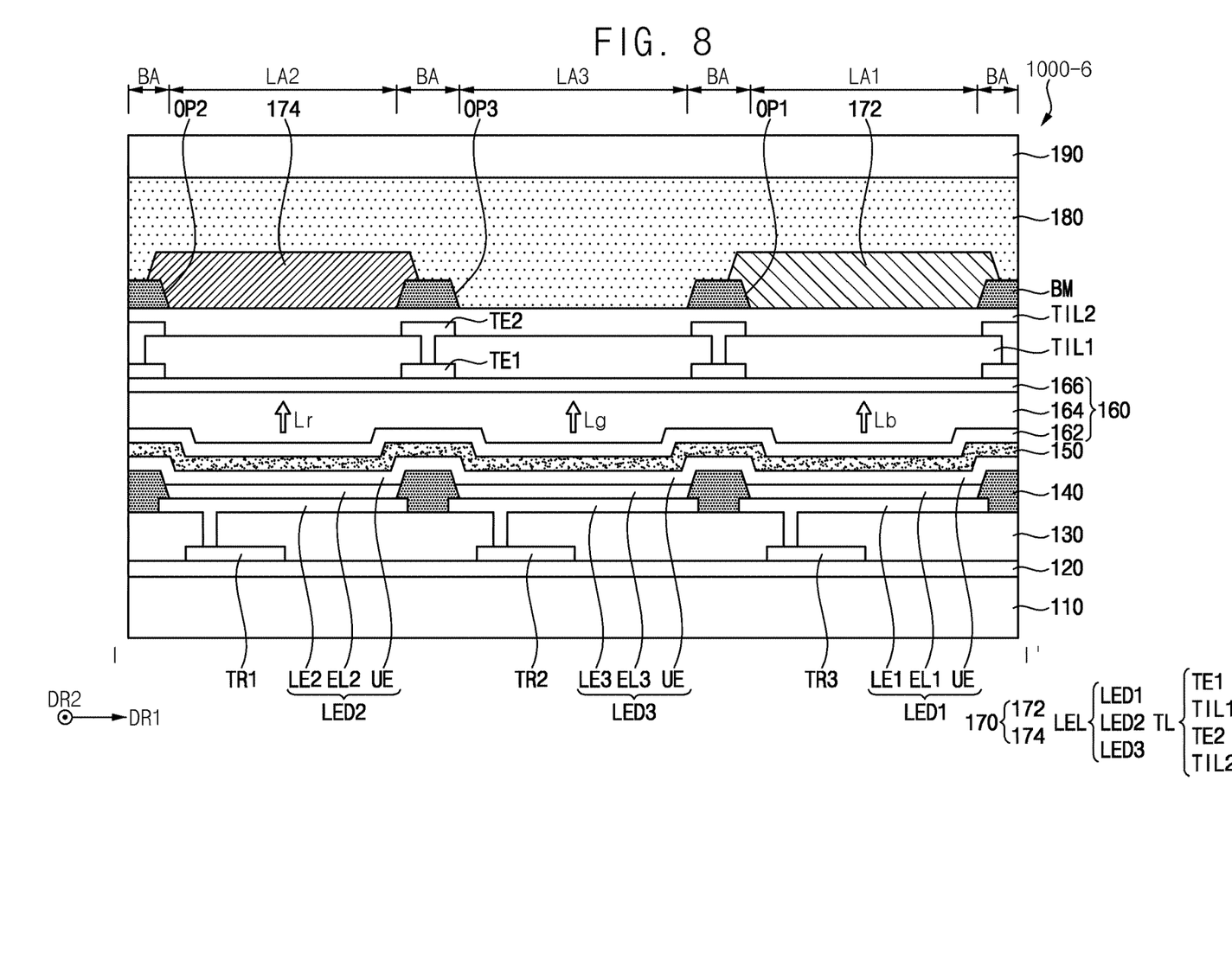
FIG. 8 is a cross-sectional view illustrating a display device according to an embodiment.

FIG. 8 is a cross-sectional view illustrating a display device 1000-6 according to an embodiment.

Referring to FIG. 8, the display device 1000-6 may include the substrate 110, the buffer layer 120, the first to third driving elements TR1, TR2, and TR3, the insulating structure 130, the pixel defining layer 140, the light emitting device layer LEL, the light control layer 150, the encapsulation layer 160, a sensing layer TL, the light blocking member BM, the color filter layer 170, the anti-reflection layer 180, and the window 190. However, the display device 1000-6 may be substantially the same as the display device 1000 described with reference to FIG. 2 except for the sensing layer TL. Therefore, repeated descriptions will be omitted.

The sensing layer TL may be disposed on the encapsulation layer 160. In this case, the light blocking member BM and the color filter layer 170 may be disposed on the sensing layer TL. In an embodiment, the sensing layer TL may include a first touch electrode TE1, a first touch insulating layer TIL1, a second touch electrode TE2, and a second touch insulating layer TIL2 in order in a direction away from the substrate 110 (or in a direction toward the color filter layer 170).

The first touch electrode TE1 may be disposed on the encapsulation layer 160. In an embodiment, the first touch electrode TE1 may be disposed in the light blocking area BA. In other words, the first touch electrode TE1 may overlap the pixel defining layer 140. The first touch electrode TE1 may include a metal, an alloy, a conductive metal oxide, a transparent conductive material, or the like.

In an, a separate insulating layer (not shown) may be additionally disposed between the encapsulation layer 160 and the first touch electrode TE1.

The first touch insulating layer TIL1 may cover the first touch electrode TE1 and may be disposed on the encapsulation layer 160. The first touch insulating layer TIL1 may include an inorganic material. Examples of inorganic materials that can be used as the first touch insulating layer TIL1 may include silicon oxide, silicon nitride, and silicon oxynitride. These may be used alone or in combination with each other. A contact hole exposing a portion of the first touch electrode TE1 to outside the first touch insulating layer TIL1 may be defined in the first touch insulating layer TIL1.

The second touch electrode TE2 may be disposed on the first touch insulating layer TIL1 and may overlap the first touch electrode TE1. In other words, the second touch electrode TE2 may both be disposed in the light blocking area BA of the display device 1000. The second touch electrode TE2 may electrically contact the first touch electrode TE1 through or at the contact hole exposing a portion of the first touch electrode TE1 to outside the first touch insulating layer TIL1. The second touch electrode TE2 may include a metal, an alloy, a conductive metal oxide, a transparent conductive material, or the like.

The first touch electrode TE1 and the second touch electrode TE2 may together constitute a touch electrode. In an embodiment, the touch electrode may have a mesh structure in a plan view. However, the invention is not necessarily limited thereto, and a structure of the touch electrode may be variously changed.

The second touch insulating layer TIL2 may cover the second touch electrode TE2 and may be disposed on the first touch insulating layer TIL1. The second touch insulating layer TIL2 may include an inorganic material. Examples of inorganic materials that can be used as the second touch insulating layer TIL2 may include silicon oxide, silicon nitride, and silicon oxynitride. These may be used alone or in combination with each other.

In an embodiment, a display device 1000 includes a light emitting area LA and a light blocking area BA which is adjacent to the light emitting area LA, a light emitting device layer LEL including a first light emitting device LED1, a second light emitting device LED2, and a third light emitting device LED3 respectively corresponding to the light emitting area LA, a light blocking layer including a light blocking member BM in the light blocking area BA, the light blocking member BM defining a first opening OP1 overlapping the first light emitting device LED1, a second opening OP2 overlapping the second light emitting device LED2, and a third opening OP3 overlapping the third light emitting device LED3, a color filter layer 170 including a first color filter 172 in the first opening OP1 of the light blocking layer and a second color filter 174 in the second opening OP2 of the light blocking layer, and an anti-reflection layer 180 on the light blocking layer and the color filter layer 170, the anti-reflection layer 180 including a pigment or a dye. The light blocking layer together with the color filter layer 170 and the anti-reflection layer 180 may define a polarizer of the display device 1000.

The display device 1000 may further include between the light emitting device layer LEL and the color filter layer 170, an inorganic light control layer (e.g., the light control layer 150) which reflects light, and an encapsulation layer 160 on the inorganic light control layer.

In an embodiment, the inorganic light control layer together with the color filter layer 170, the light blocking layer and the overcoat layer OC may defined a polarizer of the display device 1000-4.

In an embodiment, the color filter layer 170 together with the anti-reflection layer 180 may define a polarizer of the display device 1000-5, where the first color filter 172 and the second color filter 174 overlap each other in the light blocking area BA to define a light blocking member BM in the light blocking area BA.

The invention should not be construed as being limited to the embodiments set forth herein. Rather, these embodiments are provided so that this disclosure will be thorough and complete and will fully convey the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a light emitting area and a light blocking area which is adjacent to the light emitting area;
a light emitting device layer including a first light emitting device, a second light emitting device, and a third light emitting device respectively corresponding to the light emitting area;
a light blocking layer including a light blocking member in the light blocking area, the light blocking member defining a first opening overlapping the first light emitting device, a second opening overlapping the second light emitting device, and a third opening overlapping the third light emitting device;
a color filter layer including a first color filter in the first opening of the light blocking layer and a second color filter in the second opening of the light blocking layer; and
an anti-reflection layer on the light blocking layer and the color filter layer, the anti-reflection layer including a pigment or a dye,
wherein the light blocking layer together with the color filter layer and the anti-reflection layer defines a polarizer of the display device.

2. The display device of claim 1, wherein the anti-reflection layer is in the third opening of the light blocking layer.

3. The display device of claim 1, wherein
the first color filter comprises a blue color filter which selectively transmits blue light, and
the second color filter comprises a red color filter which selectively transmits red light.

4. The display device of claim 1, wherein the color filter layer further includes a third color filter in the third opening of the light blocking layer.

5. The display device of claim 4, wherein the third color filter comprises a green color filter which selectively transmits green light.

6. The display device of claim 1, further comprising between the light emitting device layer and the color filter layer:
an inorganic light control layer which reflects light, and
an encapsulation layer on the inorganic light control layer.

7. The display device of claim 6, wherein the inorganic light control layer has a refractive index of about 1 or more for light in a wavelength range of about 380 nanometers to about 780 nanometers, together with an absorption coefficient of about 0.5 or more for light in a wavelength range of about 380 nanometers to about 780 nanometers.

8. The display device of claim 7, wherein the inorganic light control layer includes at least one of bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn) and germanium (Ge).

9. The display device of claim 1, wherein the first light emitting device, the second light emitting device, and the third light emitting device include a quantum dot.

10. A display device comprising:
a light emitting area and a light blocking area which is adjacent to the light emitting area;
a light emitting device layer including a first light emitting device, a second light emitting device, and a third light emitting device respectively corresponding to the light emitting area;
a light blocking layer including a light blocking member in the light blocking area, the light blocking member defining a first opening overlapping the first light emitting device, a second opening overlapping the second light emitting device, and a third opening overlapping the third light emitting device;
a color filter layer including a first color filter in the first opening of the light blocking layer, a second color filter in the second opening of the light blocking layer and a third color filter in the third opening of the light blocking layer;
an inorganic light control layer which reflects light and is between the light emitting device layer and the color filter layer; and
an overcoat layer on the light blocking layer and the color filter layer, the overcoat layer including an inorganic material or an organic material,
wherein the inorganic light control layer together with the color filter layer, the light blocking layer and the overcoat layer defines a polarizer of the display device.

11. The display device of claim 10, wherein the inorganic light control layer has a refractive index of about 1 or more for light in a wavelength range of about 380 nanometers to about 780 nanometers, together with an absorption coefficient of about 0.5 or more for light in a wavelength range of about 380 nanometers to about 780 nanometers.

12. The display device of claim 11, wherein the inorganic light control layer includes at least one of bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), and germanium (Ge).

13. The display device of claim 10, wherein the first light emitting device, the second light emitting device, and the third light emitting device include a quantum dot.

14. A display device comprising:
   a light emitting area and a light blocking area which is adjacent to the light emitting area;
   a light emitting device layer including a first light emitting device, a second light emitting device, and a third light emitting device respectively corresponding to the light emitting area;
   a color filter layer including:
      a first color filter defining a first opening overlapping the first light emitting device, and
      a second color filter defining a second opening overlapping the second light emitting device;
   an inorganic light control layer which reflects light and is between the light emitting device layer and the color filter layer; and
   an anti-reflection layer on the color filter layer, the anti-reflection layer including a pigment or a dye,
   wherein the color filter layer together with the anti-reflection layer defines a polarizer of the display device.

15. The display device of claim 14, wherein the first color filter and the second color filter overlap each other in the light blocking area to define a light blocking member in the light blocking area.

16. The display device of claim 14, wherein the second color filter is in the first opening of the color filter layer.

17. The display device of claim 14, wherein the color filter layer defines a third opening overlapping the third light emitting device.

18. The display device of claim 17, wherein the anti-reflection layer in the third opening of the color filter layer.

19. The display device of claim 14, wherein
   the first color filter comprises a blue color filter which selectively transmits blue light, and
   the second color filter comprises a red color filter which selectively transmits blue light.

20. The display device of claim 14, wherein the first light emitting device, the second light emitting device, and the third light emitting device include a quantum dot.

* * * * *